(12) United States Patent
Abadie et al.

(10) Patent No.: US 11,165,513 B2
(45) Date of Patent: Nov. 2, 2021

(54) METHOD FOR PERFORMING A RADIATED TWO-STAGE METHOD MEASUREMENT AS WELL AS MEASUREMENT SETUP

(71) Applicant: Rohde & Schwarz GmbH & Co. KG, Munich (DE)

(72) Inventors: Vincent Abadie, Munich (DE); Moritz Harteneck, Munich (DE); Juan-Angel Anton, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 16/736,302

(22) Filed: Jan. 7, 2020

(65) Prior Publication Data

US 2020/0266904 A1  Aug. 20, 2020

(30) Foreign Application Priority Data

Feb. 19, 2019 (EP) .................................... 19158095

(51) Int. Cl.
*H04B 17/10* (2015.01)
*G01R 29/10* (2006.01)

(52) U.S. Cl.
CPC ......... *H04B 17/104* (2015.01); *G01R 29/105* (2013.01)

(58) Field of Classification Search
CPC .... H04B 17/104; H04B 17/12; H04B 7/0413; G01R 29/105
See application file for complete search history.

(56) References Cited

U.S. PATENT DOCUMENTS

| 7,826,346 | B2 | 11/2010 | Seki et al. | |
| 9,742,508 | B1 | 8/2017 | Kyosti et al. | |
| 9,866,294 | B1* | 1/2018 | Bartko | H04B 17/14 |
| 9,906,315 | B1* | 2/2018 | Bartko | H01Q 3/04 |
| 10,554,314 | B1* | 2/2020 | Rowell | H01Q 3/267 |
| 2008/0020746 | A1* | 1/2008 | Alexandar | H04W 24/06 455/423 |

(Continued)

FOREIGN PATENT DOCUMENTS

| EP | 3361654 A9 | 8/2018 |
| EP | 3399674 A1 | 11/2018 |

(Continued)

OTHER PUBLICATIONS

Foegelle, M.D., "Over-the-air performance testing of wireless devices with multiple antennas," Time & Frequency, www.rfdesign.com, pp. 44-52, Feb. 1, 2006.

(Continued)

*Primary Examiner* — Lewis G West
(74) *Attorney, Agent, or Firm* — Christensen O'Connor Johnson Kindness PLLC

(57) ABSTRACT

A method for performing a radiated two-stage method measurement on a device under test having a predefined number of antennas, comprising: placing the device under test on a positioner; establishing communication with the device under test using at least one link antenna; and measuring the antenna pattern of the device under test using a plurality of measurement antennas, wherein the plurality of measurement antennas comprise a number of measurement antennas being larger than the number of antennas of the device under test. Further, a measurement setup is shown.

13 Claims, 1 Drawing Sheet

(56) References Cited

U.S. PATENT DOCUMENTS

| | | | |
|---|---|---|---|
| 2009/0279644 A1 | 11/2009 | Maru | |
| 2014/0256373 A1* | 9/2014 | Hernandez | H04B 17/27 |
| | | | 455/509 |
| 2017/0223559 A1* | 8/2017 | Kong | H04B 7/0413 |
| 2017/0279546 A1* | 9/2017 | McGarry | H04B 7/0452 |
| 2017/0373773 A1* | 12/2017 | Jing | H04B 17/102 |
| 2018/0254840 A1* | 9/2018 | Foegelle | H04B 17/3912 |
| 2018/0321292 A1* | 11/2018 | Bartko | G01R 29/0821 |
| 2019/0058535 A1* | 2/2019 | Karajani | H04B 17/0085 |
| 2019/0103926 A1* | 4/2019 | Chen | H04B 7/0413 |
| 2020/0119460 A1* | 4/2020 | Maruo | G01R 29/105 |
| 2020/0209296 A1* | 7/2020 | Kong | G01R 29/10 |
| 2020/0213883 A1* | 7/2020 | Kong | H04B 17/0087 |
| 2020/0264223 A1* | 8/2020 | Pabst | G01R 29/0878 |

FOREIGN PATENT DOCUMENTS

| | | | |
|---|---|---|---|
| EP | 3432490 A1 | 1/2019 | |
| JP | 4128197 B2 | 7/2008 | |

OTHER PUBLICATIONS

Jing, Y., et al.: "MIMO OTA Testing Based on Transmit Signal Processing," IEEE Instrumentation and Measurement Magazine, pp. 43-50, Jun. 1, 2016.

Yasir, M. et al.: "Performance Comparison of Wavelet based OFDM (WOFDM) V-BLAST MIMO System with different detection algorithms," Emerging Technologies, ICET 2008, IEEE, 6 pages.

* cited by examiner

METHOD FOR PERFORMING A RADIATED TWO-STAGE METHOD MEASUREMENT AS WELL AS MEASUREMENT SETUP

FIELD OF THE DISCLOSURE

Embodiments of the disclosure concern a method for performing a radiated two-stage method measurement on a device under test having a predefined number of antennas as well as a measurement setup for performing radiated two-stage measurement on a device under test.

BACKGROUND

For multiple-input multiple-output (MIMO) measurements the radiated two-stage method (RTS) is known. During the first stage of the RTS, an antenna pattern of the device under test is measured and a channel matrix for the second stage is generated based on the antenna pattern.

To carry out the second stage the channel matrix has to be inverted. However, the channel matrix is not always invertible. This leads to non-testable devices under test or inconclusive tests. In these cases, a multiprobe anechoic chamber (MPAC) may be used, leading to extra hardware costs.

SUMMARY

Thus, there is a need to provide a method and measurement setup for performing a radiated two-stage method measurement on a device under test.

For this purpose others, a method for performing a radiated two-stage method measurement on a device under test having a predefined number of antennas is provided. The method in some embodiments comprises the following steps:

placing the device under test on a positioner;
establishing communication with the device under test using at least one link antenna;
measuring the antenna pattern of the device under test using a plurality of measurement antennas, wherein the plurality of measurement antennas comprise a number of measurement antennas being larger than the number of antennas of the device under test.

By providing more measurement antennas than the device under test has antennas, the channel matrix is always invertible or at least pseudoinvertible as the equation system is overdetermined due to the information of the extra antenna.

In this case, the inverse may be a pseudo inverse, which does not adversely effect the measurements of the second stage. Thus, a very cost-efficient and simple solution for performing radiated two-stage method measurements, for example MIMO over-the-air (OTA) measurements, is provided.

The at least one link antenna for establishing communication may be part of a measurement system, i.e. not part of the device under test.

In an embodiment of the disclosure, the device under test is placed on the positioner within an anechoic chamber, improving the accuracy of the antenna pattern measurement.

For improved results, the number of measurement antennas of the plurality of measurement antennas is at least, for example exactly, two times the number of antennas of the device under test.

In an embodiment of the disclosure, at least one, for example all of the plurality of measurement antennas are dual polarized antennas, wherein a dual polarized antenna is counted towards the number of measurement antennas as two. This way, the setup may be simplified.

In another embodiment, the method comprises the following further steps:

generating a channel matrix using the measurements of the plurality of measurement antennas;
inverting the channel matrix yielding more than one solution for the channel matrix inversion; and
selecting one of the solutions.

This way, the second stage, i.e. stage two of the radiated two-stage method, may be performed with certainty.

For simplifying the numerical calculation, the solution of the inversion with the smallest Euclidean norm may be selected.

For example, the device under test is a device capable of communication in a frequency range of 450 MHz and 6000 MHz so that 5G NR FR1 devices may be tested efficiently.

In some embodiments, the antennas of the device under test and the plurality of measurement antennas are configured to transmit and receive signals in the frequency range of 450 MHz and 6000 MHz For above purpose, a measurement setup for performing radiated two-stage measurements on a device under test is further provided. The measurement setup comprises a device under test having a predetermined number of antennas and a measurement system, wherein the measurement system comprises a positioner to which the device under test is attached, at least one link antenna for establishing communication with the device under test, and a plurality of measurement antennas, wherein the plurality of measurement antennas comprise a number of measurement antennas being larger than the number of antennas of the device under test.

The features and advantages discussed in the context of the method also apply to the measuring setup and vice versa.

For example, at least one, for example all of the plurality of measurement antennas are dual polarized antennas, wherein a dual polarized antenna is counted towards the number of measurement antennas as two to simplify the setup.

For undisturbed measurements, the measurement system may comprise an anechoic chamber, in which the positioner with the device under test, the at least one link antenna and the at least one plurality of measurement antennas is arranged.

In an aspect, the measurement system comprises a control circuit or unit and/or a second stage device, wherein the control circuit or unit and/or the second stage device is/are configured to carry out a method according to the disclosure as described above. In an embodiment, the second stage device may include one or more circuits for implementing this functionality or others.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
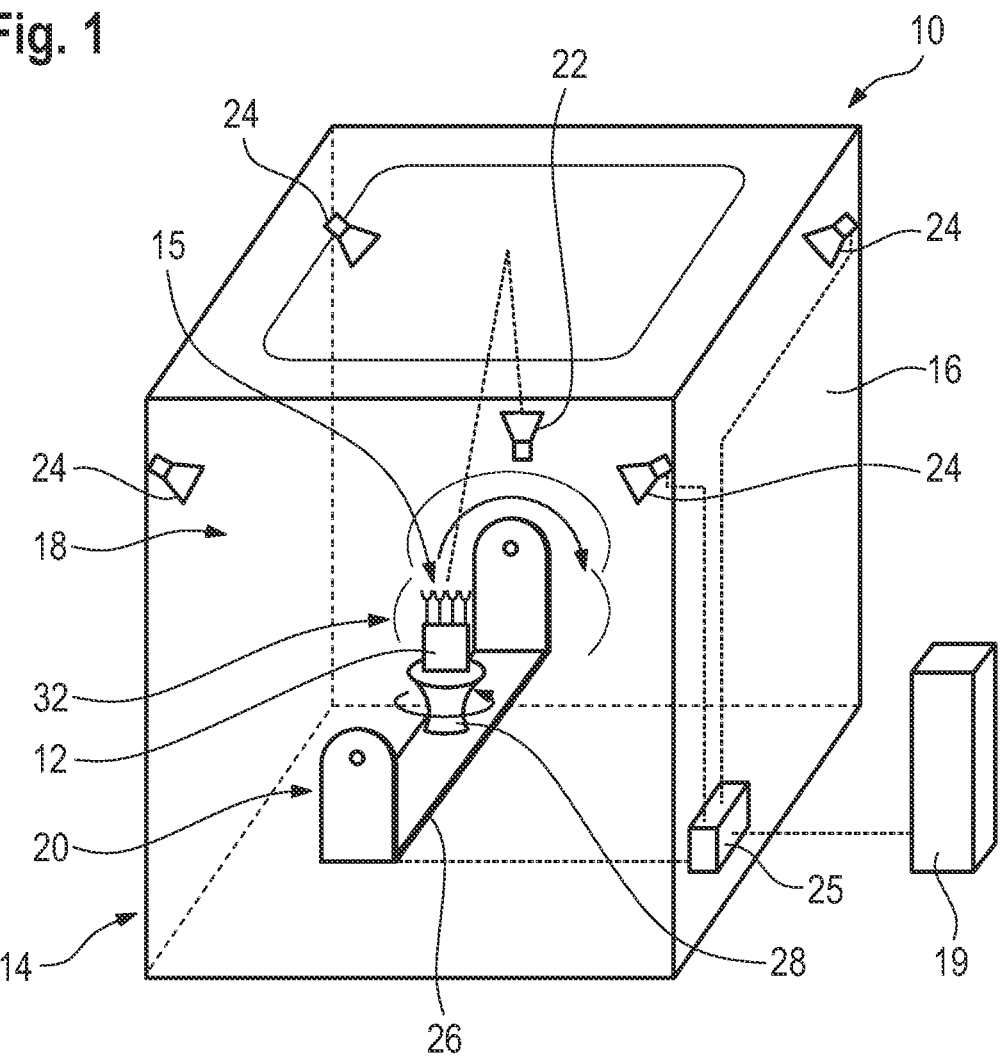
FIG. 1 shows a representative measurement setup according to the disclosure.

FIG. 1 shows an example of a measurement setup 10 having a device under test 12 (DUT) and a measurement system 14. The measurement setup 10 is used for performing multiple-input multiple-output (MIMO) over the air (OTA) measurements using the known radiated two-stage method.

The device under test 12 may be a mobile device, like a smartphone, a tablet or a laptop computer, an Internet of Things (IoT) component or any other device with a radio frequency transmitter. In some embodiments, the device under test 12 is a device for 5G NR FR1 networks. The device under test 12 has a known number N of antennas 15 for communicating with base stations of a wireless network.

The measurement system 14 is a measurement system for performing OTA measurements on a device under test in order to determine specific characteristics of the device under test 12, here the antenna pattern of the radio frequency transmitter of the device under test 12. The measurement system 14 in some embodiments comprises a housing 16 with a door (not shown), in which an anechoic chamber 18 is provided, and a second stage device 19.

In some embodiments, the measurement system 14 further comprises a positioner 20, at least one link antenna 22 and a plurality of measurement antennas 24. The positioner 20, the link antenna 22 and the measurement antennas 24 are located within the anechoic chamber 18 and they are connected to a control circuit or unit 25 of the measurement system 14.

The positioner 20 comprises a pivoting arm 26 and a turntable 28 mounted on the pivoting arm 26. The turntable 28 may be a 360° turnable turntable. The device under test 12 is securely fixed on the turntable 28, which is arranged in a quiet zone 32 of the anechoic chamber 18, even if the device under test 12 is moved by the positioner 20. Due to a combination of the movement of the pivoting arm 26 and the rotational movement of the turntable 28, the positioner 20 is able to move the device under test 12 in three dimensions so that any orientation of the device under test 12 with respect to the measurement antennas 24 can be adopted. Of course, the positioner 20 may be of any other design that enables three-dimensional movement of the device under test 12.

The number of link antennas 22 may be the same as the number N of antennas 15 of the device under test 12. For simplicity, only one link antenna 22 is shown in FIG. 1. The link antenna 22 is adapted and controlled by the control unit 25 to establish communication with the device under test 12.

The antennas 15 of the device under test 12, the measurement antennas 24 and the at least one link antenna 22 are designed for communication in the 5G NR FR1 band, i.e. in the frequency range of 450 MHz to 6000 MHZ.

The minimal number M of measurement antennas 24 of the plurality of measurement antennas 24 depends on the number N of antennas of the device under test 12 that is to be tested. The plurality of measurement antennas 24 has at least one measurement antenna 24 more than the device under test 12 comprises antennas 15, i.e. M≥N. In some embodiments, the number M of measurement antennas 24 of the plurality of measurement antennas 24 may be exactly double the number N of the antennas 15 of the device under test 12, i.e. M=2N. For example, eight measurement antennas 24 are provided in the measurement system 14 in case the device under test 12 has four antennas 15, i.e. for a 4×4 MIMO measurement; and four measurement antennas 24 are provided in the measurement system 14 in case the device under test 12 has two antennas 15, i.e. for a 2×2 MIMO measurement. The measurement antennas 24 may be dual polarized antennas, wherein dual polarized antennas are counted towards the number M of measurement antennas as two.

In the embodiment shown in FIG. 1, the device under test 12 has four antennas 15 (N=4) and the measurement system 14 has four dual polarized measurement antennas 24, which account to a number M of measurement antennas 24 equal to eight, i.e. M=8. The measurement antennas 24 are arranged equidistant to the device under test 12 and for example within the near-field distance of the device under test 12. For example, the measurement antennas 24 are arranged in the corners of the anechoic chamber 18.

The control unit 25 is configured to control the measurement system 14 to measure the antenna pattern of the antennas 15 of the device under test 12.

The second stage device 19 comprises in some embodiments all components necessary to perform the second stage of a radiated two-stage method for MIMO tests. Second stage devices are well known in the prior art and comprise, for example, a base station emulator and at least one channel emulator.

Figure 2:
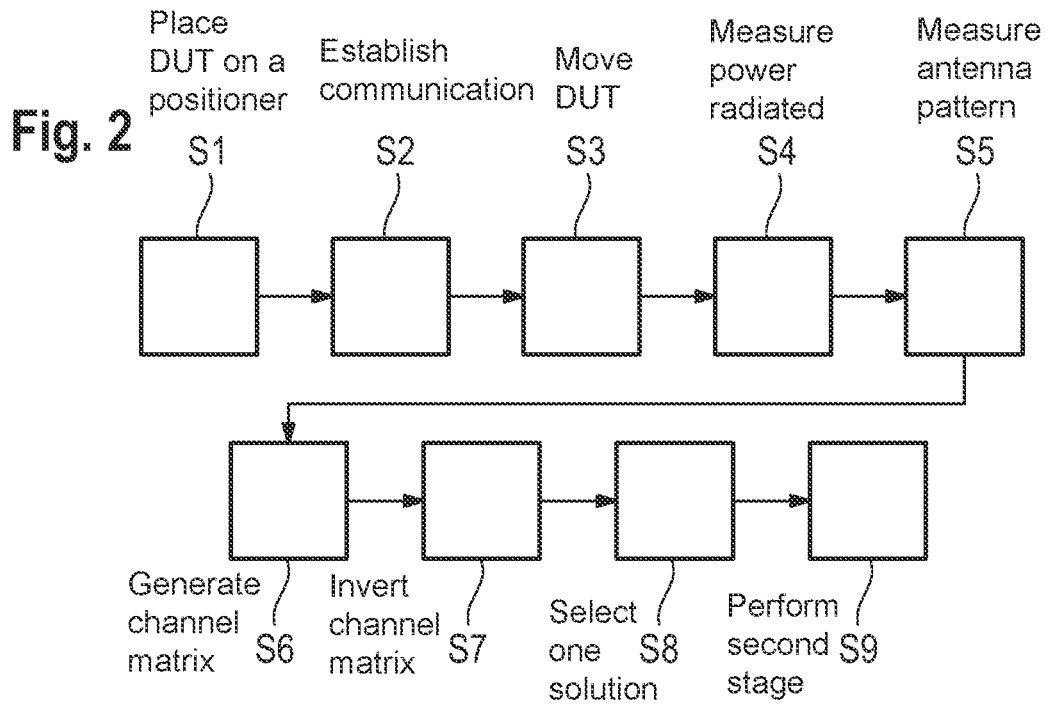
FIG. 2 shows a flow-chart of a representative method according to the disclosure.

FIG. 2 shows a flowchart for performing MIMO OTA tests with the measurement setup 10 of FIG. 1.

In a first step S1, the device under test 12 is placed in the anechoic chamber 18 on the turntable 28 of the positioner 20. The device under test 12 is fixed at the turntable 28 so that the device under test 12 can be moved by the positioner 20 in three dimensions.

In a second step S2, the control unit 25 controls the at least one link antenna 22 to establish a multi-channel communication with the device under test 12, more precisely the antennas 15 of the device under test 12.

The positioner 20 is controlled by the control unit 25 to move the device under test 12 in three dimensions so that the device under test 12 is rotated in a complete sphere (step S3). During the rotation, each of the measurement antennas 24 measures the power radiated from the device under test 12 (step S4).

Steps S3 and S4 may be carried out simultaneously or alternatingly.

In the next step S5, an antenna pattern of the antennas 15 of the device under test 12 is generated based on the powers measured by the measurement antennas 24 and the orientation of the device under test 12 with respect to the measurement antennas 24. The antenna pattern may be generated by the control unit 25 or by the second stage device 19.

In the next step S6, a channel matrix is generated based on the measurements of the plurality of measurement antennas 24. For example, the second stage device 19 generates the channel matrix.

The channel matrix is then inverted, for example also by the second stage device 19, using the measurements of the plurality of measurement antennas 24 (step S7). Due to the fact that more measurement antennas 24 than antennas 15 of the device under test 12 have been used, the system is overdetermined so that an inverse or pseudo inverse to the channel matrix may always be found. However, inverting the channel matrix yields more than one solution for the inverted matrix.

From the solutions of the channel matrix inversion, i.e. from possible inverted channel matrices, one solution is selected in step S8. For example, the solution with the minimum Euclidean norm for example is selected for carrying out the second stage of the radiated two-stage method.

In the next step S9, the second stage of the radiated two-stage method is carried out.

The second stage of the radiated two-stage method is very well known in the art so that a description is omitted.

Thus, by connecting the device under test 12 to the second stage device 19, the second stage of the radiated two-stage method can be performed so that MIMO OTA measurements may be efficiently and reliably carried out.

Due to the fact that the system is overdetermined and that the channel matrix inversion has always at least one solution, the method is very stable and robust and yet easy to implement.

Certain embodiments disclosed herein utilize circuitry (e.g., one or more circuits) in order to implement protocols, methodologies or technologies disclosed herein, operably couple two or more components, generate information, process information, encode signals, decode signals, transmit and/or receive signals, control other devices, etc. Circuitry of any type can be used.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

The present application may also reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method for performing a radiated two-stage method measurement on a device under test having a predefined number of antennas, comprising:
    placing the device under test on a positioner;
    establishing communication with the device under test using at least one link antenna;
    measuring the antenna pattern of the device under test using a plurality of measurement antennas, wherein the plurality of measurement antennas comprise a number of measurement antennas being larger than the number of antennas of the device under test;
    generating a channel matrix using the measurements of the plurality of measurement antennas;
    inverting the channel matrix yielding more than one solution for the channel matrix inversion; and
    selecting one of the solutions.

2. The method according to claim 1, wherein the device under test is placed on the positioner within an anechoic chamber.

3. The method according to claim 1, wherein the number of measurement antennas of the plurality of measurement antennas is at least two times the number of antennas of the device under test.

4. The method according to claim 3, wherein the number of measurement antennas of the plurality of measurement antennas is exactly two times the number of antennas of the device under test.

5. The method according to claim 1, wherein at least one of the plurality of measurement antennas are dual polarized antennas, wherein a dual polarized antenna is counted towards the number of measurement antennas as two.

6. The method according to claim 5, wherein all of the plurality of measurement antennas are dual polarized antennas.

7. The method according to claim 1, wherein the selected solution is the solution with the smallest Euclidean norm.

8. The method according to claim 1, wherein the device under test is a device capable of communication in a frequency range of 450 MHz and 6000 MHz.

9. A measurement setup for performing radiated two-stage method measurements on a device under test, comprising a device under test having a predetermined number of antennas and a measurement system, wherein the measurement system comprises:
    a positioner to which the device under test is attached;
    at least one link antenna for establishing communication with the device under test;
    a plurality of measurement antennas, wherein the plurality of measurement antennas comprise a number of measurement antennas being larger than the number of antennas of the device under test;
    the measurement system generating a channel matrix using the measurements of the plurality of measurement antennas;

the measurement system inverting the channel matrix yielding more than one solution for the channel matrix inversion; and the measurement system selecting one of the solutions.

10. The measurement setup according to claim 9, wherein at least one of the plurality of measurement antennas are dual polarized antennas, wherein a dual polarized antenna is counted towards the number of measurement antennas as two.

11. The measurement setup according to claim 10, wherein all of the plurality of measurement antennas are dual polarized antennas.

12. The measurement setup according to claim 9, wherein the measurement system comprises an anechoic chamber, in which the positioner with the device under test, the at least one link antenna and the at least one plurality of measurement antennas is arranged.

13. The measurement setup according to claim 9, wherein the measurement system comprises at least one of a control circuit and a second stage device, wherein at least one of the control circuit and the second stage device is configured to control the measurement system to:

establish communication with the device under test using the at least one link antenna;

measure the antenna pattern of the device under test using the plurality of measurement antennas, wherein the plurality of measurement antennas comprise a number of measurement antennas being larger than the number of antennas of the device under test.

* * * * *